(12) United States Patent
Park

(10) Patent No.: US 10,396,734 B1
(45) Date of Patent: Aug. 27, 2019

(54) DIFFERENTIAL TRANSIMPEDANCE AMPLIFIER

(71) Applicant: EWHA UNIVERSITY-INDUSTRY COLLABORATION FOUNDATION, Seoul (KR)

(72) Inventor: Sung Min Park, Seongnam-si (KR)

(73) Assignee: EWHA UNIVERSITY—INDUSTRY COLLABORATION FOUNDATION, Seoul (KR)

( * ) Notice: Subject to any disclaimer, the term of this patent is extended or adjusted under 35 U.S.C. 154(b) by 0 days.

(21) Appl. No.: 16/425,274

(22) Filed: May 29, 2019

Related U.S. Application Data

(62) Division of application No. 15/311,122, filed as application No. PCT/KR2015/005859 on Jun. 11, 2015.

(30) Foreign Application Priority Data

Jun. 11, 2015 (KR) ........................ 10-2014-0070638

(51) Int. Cl.
| H03G 1/00 | (2006.01) |
| H03F 3/45 | (2006.01) |
| H03F 1/08 | (2006.01) |
| H03F 3/26 | (2006.01) |

(52) U.S. Cl.
CPC .......... *H03G 1/0035* (2013.01); *H03F 1/086* (2013.01); *H03F 3/265* (2013.01); *H03F 3/45179* (2013.01); *H03G 1/0029* (2013.01); *H03F 2200/541* (2013.01); *H03F 2200/72* (2013.01); *H03F 2200/75* (2013.01); *H03F 2203/45288* (2013.01)

(58) Field of Classification Search
USPC ........................ 330/301, 311, 291, 252–261
See application file for complete search history.

(56) References Cited

U.S. PATENT DOCUMENTS

| 6,566,949 B1 | 5/2003 | Park |
| 7,760,028 B2 | 7/2010 | Sanduleaun et al. |
| 9,094,634 B2 | 7/2015 | Su et al. |
| 2002/0167357 A1 | 11/2002 | Renous |
| 2008/0290957 A1 | 11/2008 | Li et al. |

FOREIGN PATENT DOCUMENTS

| KR | 10-2008-0061480 A | 7/2008 |
| KR | 10-2010-0115843 A | 10/2010 |
| KR | 10-2010-0138057 A | 12/2010 |

OTHER PUBLICATIONS

International Search Report for PCT/KR2015/005859 dated Sep. 24, 2015 from Korean Intellectual Property Office.

*Primary Examiner* — Hieu P Nguyen
(74) *Attorney, Agent, or Firm* — Paratus Law Group, PLLC

(57) ABSTRACT

Disclosed is a differential transimpedance amplifier. The differential transimpedance amplifier includes a common gate amplifier configured to receive an electrical signal from an input node, and a common source amplifier configured to have a feedback resistor and receive the electrical signal form the input node. An output signal of the common gate amplifier and an output signal of the common source amplifier form a differential signal pair. The common gate amplifier and the common source amplifier each includes a load having a transformer which removes an effect of parasitic capacitance.

8 Claims, 4 Drawing Sheets

DIFFERENTIAL TRANSIMPEDANCE AMPLIFIER

CROSS REFERENCE TO PRIOR APPLICATIONS

This application is a Divisional of U.S. patent application Ser. No. 15/311,122 (filed on Nov. 14, 2016), which is a National Stage Patent Application of PCT International Patent Application No. PCT/KR2015/005859 (filed on Jun. 11, 2015) under 35 U.S.C. § 371, which claims priority to Korean Patent Application No. 10-2014-0070638 (filed on Jun. 11, 2014), which are all hereby incorporated by reference in their entirety.

BACKGROUND

The present invention relates to a differential transimpedance amplifier.

A transimpedance amplifier refers to an amplifier which receives a current and outputs a voltage signal. The transimpedance amplifier is used for a high-speed communication receiving stage such as an optical receiver for 100 Gbps Ethernet, an optical link, or a board to board interconnection, etc. Korea Patent Publication No. 2010-0138057, which was filed by an applicant of the present invention, exists as a conventional art related to the transimpedance amplifier.

A conventional transimpedance amplifier has a single-ended configuration, and is a structure of obtaining one output from one input signal. Accordingly, when the transimpedance amplifier is used for a receiving stage in which noise sensitivity is important, an influence of power noise and ground noise is great.

In order to reduce the influence of the noise, since a low pass filter should be implemented when adding a single-ended to a differential-ended conversion circuit, a die size is increased. A replica circuit can be used for the single-ended to differential-ended conversion circuit, but the die size and power consumption is still increased.

In order to solve the problems of the conventional art described above, the present invention is directed to a differential transimpedance amplifier capable of obtaining a differential output corresponding to an input signal without increasing a die size and power consumption compared with a conventional art.

Further, the present invention is directed to a differential transimpedance amplifier capable of controlling an input resistance of a circuit by controlling a feedback resistance.

An aspect of the present invention provides a differential transimpedance amplifier, including: a common gate amplifier configured to receive an electrical signal from an input node; and a common source amplifier configured to have a feedback resistor and receive the electrical signal from the input node, wherein an output signal of the common gate amplifier and an output signal of the common source amplifier form a differential signal pair.

According to an embodiment of the present invention, since each output signal of a common gate amplifier and a common source amplifier forms a differential signal, a differential pair may be implemented without forming a passive low-pass filter or a replica circuit for single-ended to differential-ended conversion and thus a die size and power consumption may be decreased.

Further, since an input resistance of the common gate amplifier and a gain of the common source amplifier are controlled by controlling a feedback resistance, a symmetric differential output may be obtained.

DETAILED DESCRIPTION

Figure 1:
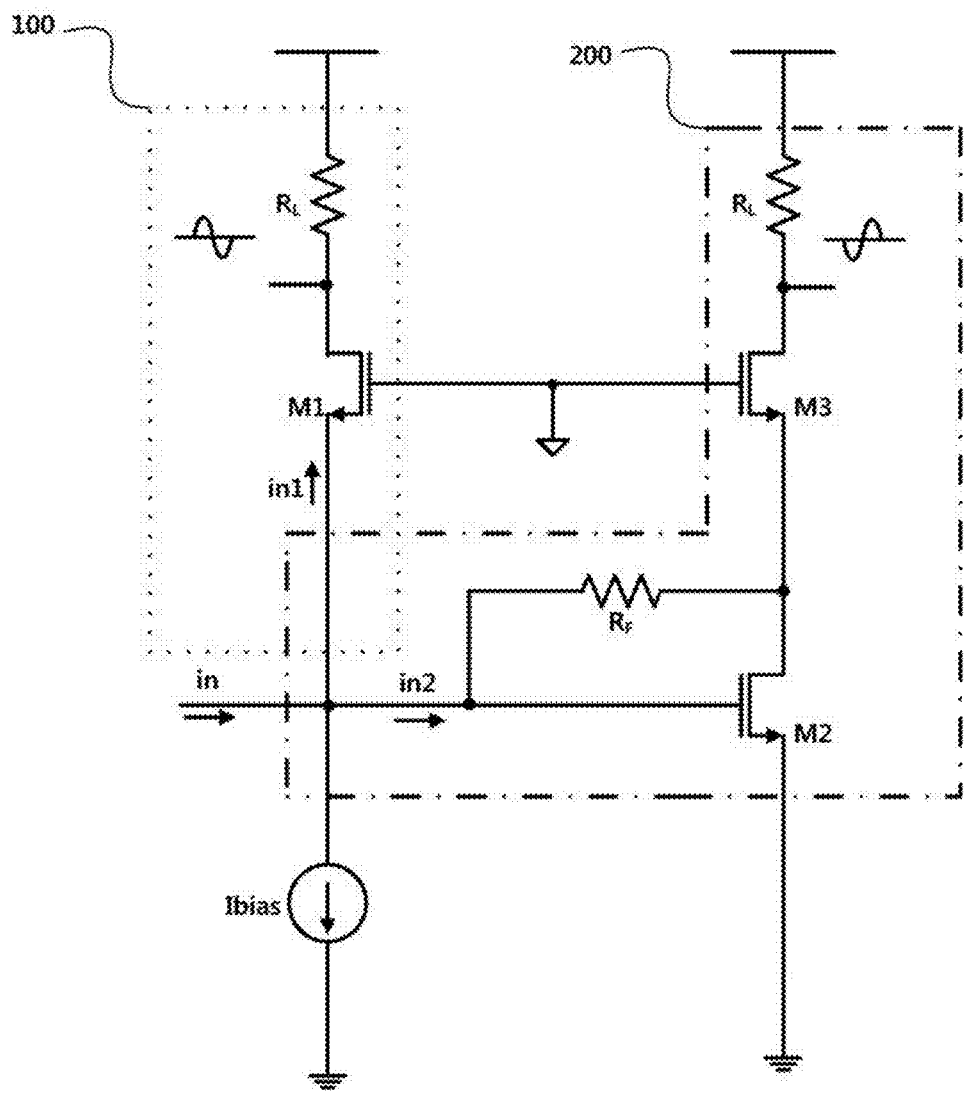
FIG. 1 is a schematic circuit diagram illustrating a differential transimpedance amplifier according to one embodiment of the present invention.

Since a description related to the present invention is merely for explaining embodiments is a structural or functional description, it should be understood that the scope of the present invention is not limited by embodiments described in the specification. That is, since embodiments of the present invention are variously changeable and may have various forms, it should be understood that the scope of the present invention includes equivalents capable of implementing the technical spirit of the present invention.

Meanwhile, meanings of the terms described in the specification should be understood as follows.

Although the terms first, second, etc. may be used herein in order to differentiate one element from another element, the scope of the present invention is not to be construed as limited by these terms. For example, a first element could be termed a second element, and similarly, a second element could be termed a first element.

When one element is described as being located "on" or "above" another element, it should be understood that one element may be located directly on or above another element, or that there may be an intermediate element between the two elements. On the other hand, when one element is described as being "in contact with" another element, it should be understood that there is no intermediate element between the two elements. Meanwhile, other expressions describing a relationship between elements, for example, "interpose ~" and "directly interpose ~", "between ~" and "directly between" or "adjacent to ~" and "directly adjacent to ~", etc. should be understood in the same manner.

The articles "a," "an," and "the" are singular in that they have a single referent, however the use of the singular form in the present document does not preclude the presence of more than one referent. It should be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless steps are clearly described otherwise, each step may be performed differently from a flow of an operation described in the specification. That is, each step may be performed simultaneously, be substantially performed at the same time, or be performed in a reverse order. In order to describe embodiments of the present invention, a size, a height, a thickness, etc. may be intentionally exaggerated in the accompanying drawings for convenience of explanation, and may not be enlarged or reduced according to a ratio. Further, one element shown in the accompanying drawing may be expressed by being intentionally reduced, and another element may be expressed by being intentionally enlarged.

Unless otherwise defined, all terms used herein have the same meaning as commonly understood by one of ordinary skill in the art to which this invention belongs. It should be further understood that terms, such as those defined in commonly used dictionaries, be interpreted as having a meaning that is consistent with their meaning in the context of the relevant art and this specification and will not to be interpreted in an idealized or overly formal sense unless expressly so defined herein.

Hereinafter, a differential transimpedance amplifier according to an embodiment of the present invention will be described with reference to the accompanying drawings. FIG. 1 is a schematic circuit diagram illustrating a differential transimpedance amplifier according to one embodiment of the present invention. Referring to FIG. 1, the differential transimpedance amplifier may include a common gate amplifier 100, and a common source amplifier 200 having a feedback resistor RF.

The common gate amplifier 100 may be implemented by a metal oxide semiconductor (MOS)transistor M1 and a load resistor $R_L$, an input current in1 may be provided to a source of the common gate amplifier 100, and an output signal vo1 may be output from a drain. Further, a gate of the common gate amplifier 100 may be connected to an alternating current (AC) reference potential. The AC reference potential may refer to a potential in which there is no change according to a time in terms of an AC since there are no small AC signal components. As one example, the AC reference potential may be a ground potential, and as another example, the AC reference potential may be a direct current (DC) potential providing a constant DC voltage which is not changed according to a time.

An input resistor Rin1 of the common gate amplifier 100 may reciprocate a transfer conductance gm1 of the transistor M1, and a voltage gain of the common gate amplifier 100 may be gm1$R_L$ which is a value obtained by multiplying the transfer conductance gm1 of the transistor M1 and a value of a load resistor $R_L$. Accordingly, a transimpedance gain A1 of an output voltage for the input current may be obtained by multiplying the voltage gain and a value of the input resistor as per the following Equation 1.

$$A_1 = \frac{vo1}{in1} = \frac{vo1}{\frac{vin}{Rin}} = Av \cdot Rin = gm_1 \frac{R_L}{gm_1} = R_L \qquad \text{[Equation 1]}$$

That is, in the common gate amplifier, it may be seen that the transistor M1 may perform a function of a current buffer and the output voltage vo1 is formed by multiplying the output current to the load resistor $R_L$.

A current source Ibias apply a bias current. Since an operating point Q and the transfer conductance gm1 of the transistor M1 included in the common gate amplifier is determined by the bias current due to the current source, an input resistance Rin of the common gate amplifier may be determined by the current to which the current source is applied.

The common source amplifier 200 may include a transistor M2 having a gate to which an input current in2 is applied, a source which is electrically connected to the reference potential, and a drain which is electrically connected to a load and outputs an output signal vo2, and a feedback resistor RF connected between the drain and the gate.

The input impedance A2 for the common source amplifier having the feedback resistor may be obtained by the following Equation 2.

$$A_2 = \frac{vo2}{in2} = \frac{R_F}{1+gm_2 R} \qquad \text{[Equation 2]}$$

Here, gm2 represents a transconductance of the transistor M2, and R represents an equivalent resistance of the load connected to the transistor M2. Similarly, a transistor M3 may have a gate connected to the AC reference potential like the transistor M1, and may operate as an active load of the transistor M2. Accordingly, in Equation 2, R may be an equivalent resistance of transistor M3 and $R_L$, seen from drain of transistor M2.

A common source amplifier 200 has character that a phase of the input signal and a phase of the output signal are inverted from each other. As can be seen from Equation 1, in the common gate amplifier, the gain of the voltage for the input current may be controlled by controlling a resistance value of the load resistor, and the gain of the common source amplifier 200 may be controlled by controlling a resistance value of the feedback resistor RF. Accordingly, a differential transimpedance amplifier providing voltage signal outputs which complement each other in response to one input current signal in may be formed by controlling the resistance values of two resistors.

Figure 2:
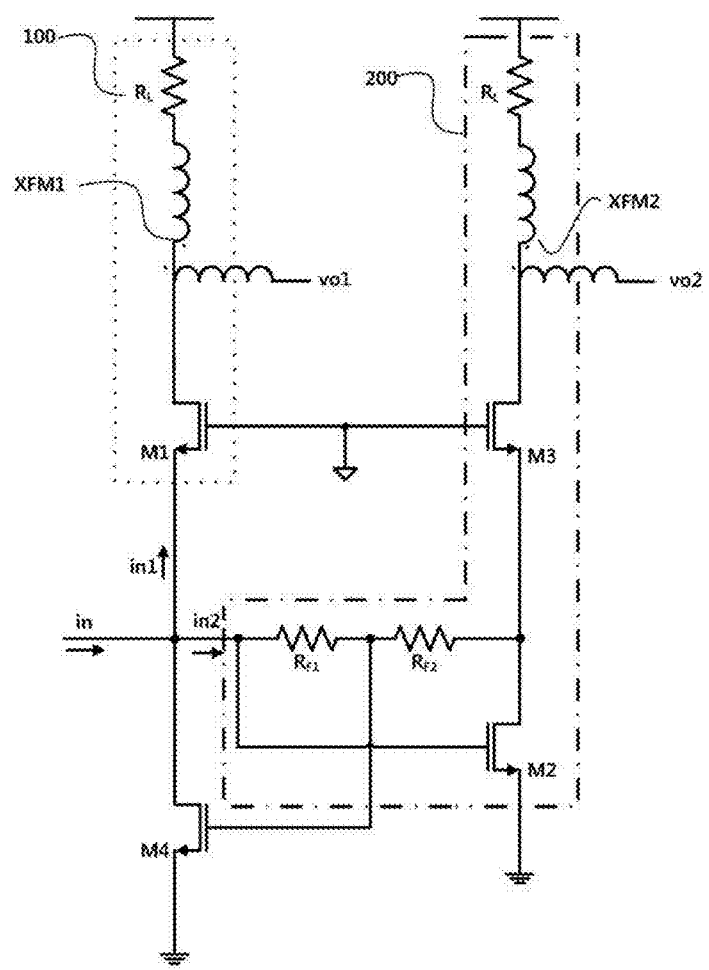
FIG. 2 is a schematic circuit diagram illustrating a differential transimpedance amplifier according to another embodiment of the present invention.

FIG. 2 is a schematic circuit diagram illustrating a differential transimpedance amplifier according to another embodiment of the present invention. A description of a portion duplicated with the embodiment described above will be omitted. Referring to FIG. 2, the common gate amplifier 100 and the common source amplifier 200 may provide output signals vo1 and vo2 through transformers XFM1 and XFM2. The transformers XFM1 and XFM2 may reduce effects of parasitic capacitance on a line. Accordingly, a bandwidth may be increased so as to allow the transimpedance amplifier to operate at high speed.

Further, in this embodiment, the feedback resistor may be divided into $R_{F1}$ and $R_{F2}$, and a voltage divided by the divided resistors may be applied to a gate of a transistor M4 to control the transistor M4. The bias current of the transistor M1 included in the common gate amplifier may be controlled by controlling voltage applied to the gate of the transistor M4, and thus the input resistance of the common gate transistor 100 may be controlled.

Simulation Test Example

Figure 3:
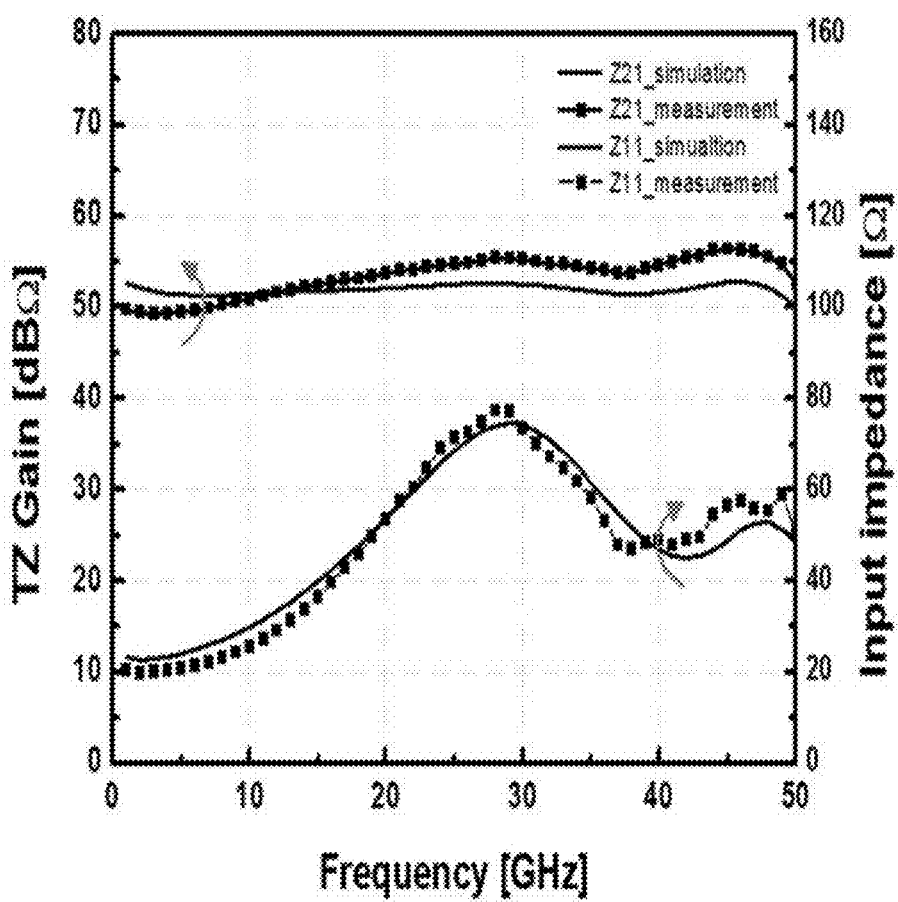
FIG. 3 is a diagram illustrating a simulation test and measurement results of an input impedance and a transimpedance gain of a differential transimpedance amplifier according to an embodiment of the present invention.

Hereinafter, a simulation test example of a differential transimpedance amplifier according to an embodiment of the present invention will be described with reference to the accompanying drawing. FIG. 3 is a diagram illustrating a simulation test of an input impedance of an input terminal and measurement results of a transimpedance gain of a differential transimpedance amplifier according to an embodiment of the present invention.

Generally, a transimpedance amplifier may receive a current formed by an optical receiving device such as a photo diode receiving an optical input, and output a voltage signal. Accordingly, in order to sufficiently receive the current signal, the transimpedance amplifier may be required to have a low input impedance unlike a voltage mode amplifier receiving a voltage signal. Further, the transimpedance amplifier may be required to have a uniform gain in an entire frequency region in which the amplifier operates.

It may be confirmed from the simulation test and measurement results that the differential transimpedance amplifier according to the embodiment of the present invention has a uniform transimpedance gain z21 of 50 to 55 dBΩ until a frequency of 50 GHz as shown in FIG. 3, and has an input impedance z11 of about 20 to 80Ω in the same frequency region.

Figure 4:
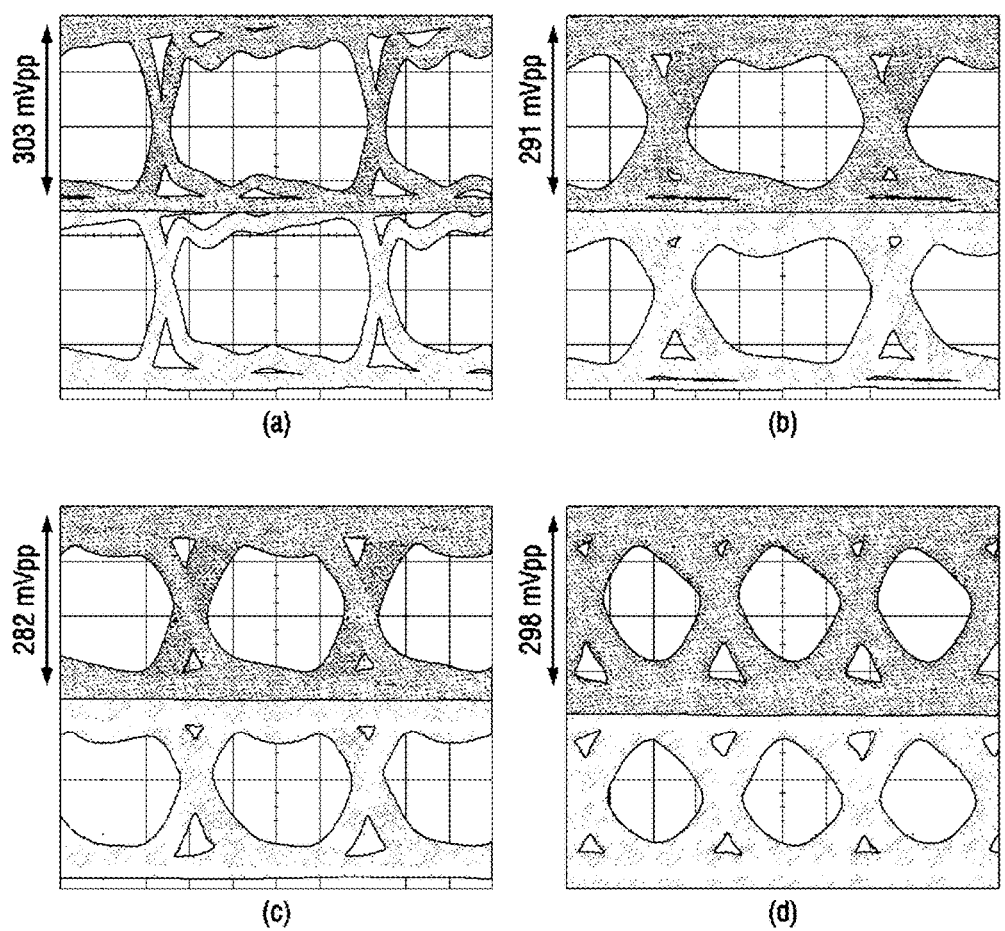
FIG. 4 is an eye-diagram of a differential transimpedance amplifier according to an embodiment of the present invention.

FIG. 4 is an eye-diagram of a different transimpedance amplifier according to an embodiment of the present invention. FIG. 4 is eye-diagram measurement results of a pseudo random binary sequence, which is $2^{32}-1$, of 10 Gb/s in FIG. 4(a), 20 Gb/s in FIG. 4(b), 25 Gb/s in FIG. 4(c), and 32 Gb/s in FIG. 4(d). As can be confirmed from each drawing, since an eye is uniformly opened in an entire frequency region in which the differential transimpedance amplifier according to an embodiment of the present invention operates, it may be confirmed that a high signal quality is provided.

While the present invention is described with reference to the above-described exemplary embodiments, these should be considered in a descriptive sense only, and it should be apparent to those skilled in the art that various modifications can be made to the above-described exemplary embodiments of the present invention without departing from the spirit or scope of the invention and all such modifications and changes are included in the scope of the appended claims and their equivalents.

What is claimed is:

1. A differential transimpedance amplifier, comprising:
   a common gate amplifier configured to receive an electrical signal from an input node; and
   a common source amplifier configured to have a feedback resistor and receive the electrical signal form the input node,
   wherein an output signal of the common gate amplifier and an output signal of the common source amplifier form a differential signal pair, and
   wherein the common gate amplifier and the common source amplifier each includes a load having a transformer which removes an effect of parasitic capacitance.

2. The differential transimpedance amplifier of claim 1, wherein a current source controlling an input resistance of the common gate amplifier is electrically connected to the input node.

3. The differential transimpedance amplifier of claim 1, wherein the common gate amplifier includes a first MOS transistor including a source which is electrically connected to the input node, a drain which is electrically connected to a load and which outputs an output signal, and a gate which is electrically connected to an alternating current (AC) reference potential.

4. The differential transimpedance amplifier of claim 1, wherein the common source amplifier includes a second MOS transistor including a source connected to a reference potential, a gate which is electrically connected to the input node, and a drain which is electrically connected to a load and which outputs an output signal.

5. The differential transimpedance amplifier of claim 1, wherein gains of the common gate amplifier and the common source amplifier are matched by controlling the feedback resistor.

6. The differential transimpedance amplifier of claim 4, wherein the feedback resistor comprises resistors connected in series.

7. The differential transimpedance amplifier of claim 6, further comprising:
   a metal oxide semiconductor (MOS) transistor,
   wherein the MOS transistor includes a drain which is electrically connected to the input node, a source which is electrically connected to a reference potential, and a gate which is connected to a node in between where the resistors connected in series.

8. The differential transimpedance amplifier of claim 1, wherein the differential transimpedance amplifier is provided with a single ended input current signal and outputs the differential signal pair of voltage.

* * * * *